United States Patent [19]

Cantarini

[11] Patent Number: 5,549,762

[45] Date of Patent: Aug. 27, 1996

[54] PHOTOVOLTAIC GENERATOR WITH DIELECTRIC ISOLATION AND BONDED, INSULATED WAFER LAYERS

[75] Inventor: William F. Cantarini, Redondo Beach, Calif.

[73] Assignee: International Rectifier Corporation, El Segundo, Calif.

[21] Appl. No.: 372,600

[22] Filed: Jan. 13, 1995

[51] Int. Cl.$^6$ ................................................. H01L 31/05
[52] U.S. Cl. ................................................. 136/249; 437/2
[58] Field of Search ................................ 136/249 MS

[56] References Cited

U.S. PATENT DOCUMENTS

| | | | |
|---|---|---|---|
| 3,994,012 | 11/1976 | Warner, Jr. | 136/246 |
| 4,227,098 | 10/1980 | Brown et al. | 307/117 |
| 4,268,843 | 5/1981 | Brown et al. | 257/82 |
| 4,390,790 | 6/1983 | Rodriguez | 250/551 |
| 4,477,721 | 10/1984 | Chappell et al. | 257/82 |
| 4,612,408 | 9/1986 | Moddel et al. | 136/244 |
| 4,755,697 | 7/1988 | Kinzer | 327/432 |
| 4,864,126 | 9/1989 | Walters et al. | 250/551 |
| 4,916,323 | 4/1990 | Hayashi et al. | 250/551 |
| 4,931,656 | 6/1990 | Ehalt et al. | 250/551 |
| 5,045,709 | 9/1991 | Ogawa | 250/551 |
| 5,057,694 | 10/1991 | Idaka et al. | 250/551 |
| 5,105,090 | 4/1992 | Miyajima et al. | 250/551 |
| 5,151,602 | 9/1992 | Idaka et al. | 250/551 |
| 5,260,592 | 11/1993 | Mead et al. | 257/291 |
| 5,357,121 | 10/1994 | Miyashita et al. | 257/79 |

FOREIGN PATENT DOCUMENTS 1-273362  11/1989  Japan .............................. 136/249 MS

*Primary Examiner*—Aaron Weisstuch
*Attorney, Agent, or Firm*—Ostrolenk, Faber, Gerb & Soffen, LLP

[57] ABSTRACT

A photovoltaic generator device for producing an output sufficient to turn on a MOS-gated device consists of a plurality of planar photogenerators connected in series. Each of the photovoltaic generators is contained on its own respective insulated tub. The insulated tubs are formed by wafer bonding a junction-containing wafer to a handle wafer with a dielectric isolation layer between them. The individual tubs are formed at their sides by isolation trenches which enclose each tub and which extend to the dielectric layer between the junction-containing and handle wafers. Each tub is formed of an $N^-$ body having a shallow $P^+$ diffusion. $N^+$ contact regions are formed in the $N^-$ body and contact strips connect the devices of each of the tubs in series by connecting the $P^+$ diffusions of one tub to the $N^+$ contact of an adjacent tub.

20 Claims, 3 Drawing Sheets

5,549,762

PHOTOVOLTAIC GENERATOR WITH DIELECTRIC ISOLATION AND BONDED, INSULATED WAFER LAYERS

BACKGROUND OF THE INVENTION

This invention relates to photovoltaic generators for producing a control signal for the control of a semiconductor switching device, and more specifically relates to a novel structure for such a device in which an array of planar cells formed in a silicon substrate are dielectrically isolated from one another in an insulated wafer-bonded assembly.

Photovoltaic generators (PVG) are well known and are commonly used for producing a control signal for a solid state relay. Such devices employ an LED which is energized by input terminals to irradiate the photosensitive surface of a spaced and insulated photovoltaic device. The output of the photovoltaic device may serve as the input to a switching device, such as a MOS-gated device, typically a power MOSFET, which has load terminals which are switched "on" in response to the energization of the LED. The input and output terminals of the relay are isolated by the gap between the LED and the photovoltaic device. Commonly, the photovoltaic device consists of a large number of series-connected photovoltaic cells in order to produce a voltage sufficiently high to turn on the power switching device. Such devices are well known and are sold under the name "PVI" (photovoltaic isolator) by the International Rectifier Corporation of El Segundo, Calif., the assignee of the present invention.

The plural cell photogenerator can be made in many different ways. One known generator employs a stack or pile of photovoltaic cells as shown in U.S. Pat. No. 4,755,697 to Kinzer. Other devices employ a planar array of cells which are junction isolated from one another and are connected in series at their surfaces. Still other devices are known in which individual cells disposed over the surface of a silicon chip are junction-isolated from one another or may be dielectrically isolated, as shown in U.S. Pat. Nos. 4,227,098 and 4,390,790.

The prior art devices have the drawback of being expensive to manufacture and having low manufacturing yields. It is desirable to produce a photovoltaic generator which is capable of producing a large number of insulated cells which can be connected in series to produce a turn-on signal for a power MOS-gated device but which is easily manufactured, using existing reliable processing equipment and techniques.

BRIEF DESCRIPTION OF THE INVENTION

In accordance with the present invention, 1 dielectrically isolated planar photogenerating cells are formed in a flat, thin dielectrically bonded silicon wafer consisting of a relatively thick "handle" wafer which is oxide-bonded to and insulated from a thin device wafer (a junction-receiving layer). Individual planar and spaced wells or tubs are formed by an array of intersecting trenches which extend through the thin device layer to the oxide bonding region to fully dielectrically insulate each of the tubs. Each of the tubs has an $N^+$ bottom surface and $N^+$ top contact region and a $P^+$ diffusion defining a "$P^-$ on N" solar cell type arrangement. The $N^+$ top contact of each cell is connected to the $P^+$ contact of an adjacent cell to connect each of a predetermined cells, for example, 16 cells in series.

The upper surface of the device is then exposed to the radiation output of a spaced LED to produce output voltages from each of the cells. These outputs, connected in series, produce a signal which can control the switching of a MOS-gated device.

Other features and advantages of the present invention will become apparent from the following description of the invention which refers to the accompanying drawings.

DETAILED DESCRIPTION OF DRAWINGS

Figure 1:
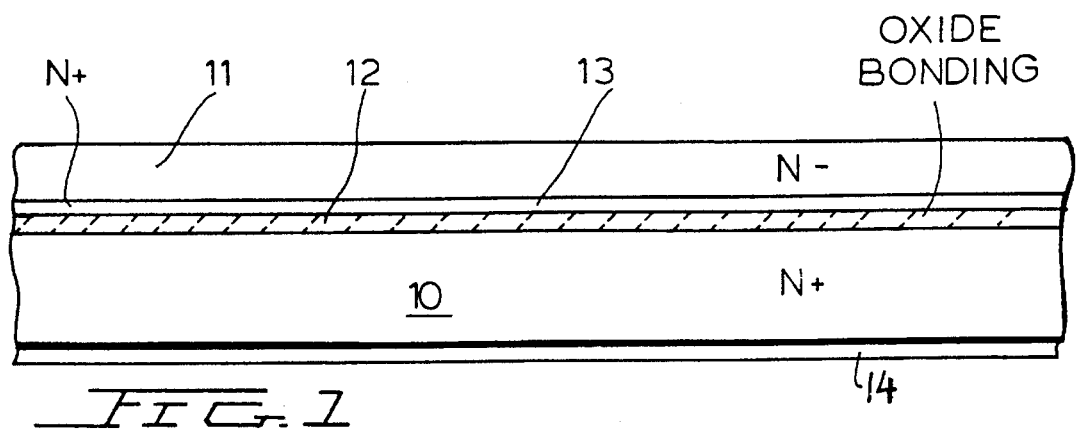
FIG. 1 shows a small portion of an oxide bonded handle wafer and device wafer.

Referring first to FIG. 1, there is shown therein a starting wafer which consists of an $N^+$ handle wafer 10 and a coextensive $N^-$ device layer 11 which is bonded to handle wafer 10 by oxide layer 12. The bottom of $N^-$ device layer 11, which is very thin compared to the thickness of handle wafer 10, contains a shallow $N^+$ diffusion 13 adjacent oxide layer 12.

Figure 2:
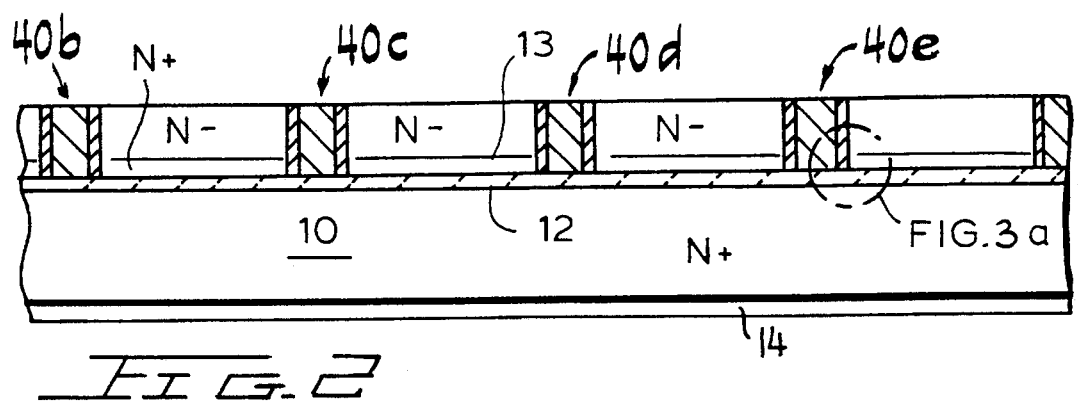
FIG. 2 shows the wafer of FIG. 1 following the formation of isolation trenches to dielectrically separate and define isolated cells or tubs.

In one preferred embodiment of the invention, shown in FIG. 2, handle wafer 10 may have a non-critical thickness of from about 375 to 525 micrometers, and a high, non-critical concentration of $N^+$ carriers. A metal layer 14 may be disposed over the bottom of wafer 10 for mounting purposes.

The device layer or wafer 11 is of monocrystalline silicon, and contains the diffusions defining each of the photovoltaic cells of the device. Layer 11 may have a thickness of about 20 micrometers, although it could range from 5 to 50 micrometers, and a resistivity of about 2 to about 12 ohm centimeters.

The dielectric bonding layer 12 has a thickness of about 0.45 micrometers and electrically insulates wafers 10 and 11. Other oxide thicknesses can be used, and are chosen to allow monitoring of the subsequent trench etch for completion of the etch.

Any desired known process can be used to bond wafers 10 and 11. Such processes are described, for example, in Wafer Bonding Technique etc. by Abe et al. in the publication Solid State Technology, November 1990, pages 39, 40 and in Silicon Wafer Bonding etc. by Abe et al. in Proceedings of 4th Intl. Symposium On Silicon-On-Insulator Technology and Devices, May 6–11, 1990, Montreal.

Figure 3:
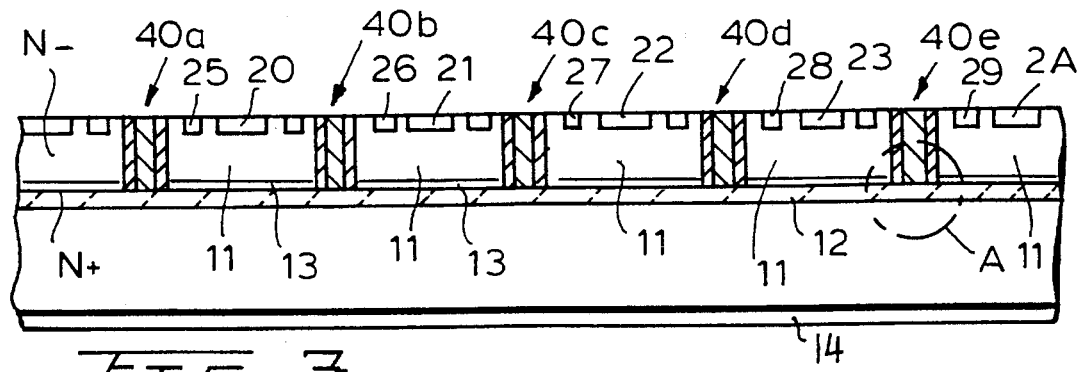
FIG. 3 shows the diffusion of spaced, shallow $P^+$ regions and $N^+$ contacts in the device wafer or layer of FIG. 2.

After forming the bonded assembly of FIG. 1, the wafer 11 is processed to form a grid of deep trench isolations 40 which surround and isolate each of the $N^+$ collector contact regions and extend through N⁺ buried layer 13 to the dielectric layer 12. Portions of the trench are shown in FIGS. 2 and 3 in cross-section as portions 40a, 40b, 40c, 40d and 40e. The trenches create dielectrically isolated "tubs" in layer 11, shown in FIG. 3, each of a surface area of about 10 mils by 10 mils with a trench gap which typically may be 20 to 25 micrometers. Other dimensions can be used.

Figure 3A:
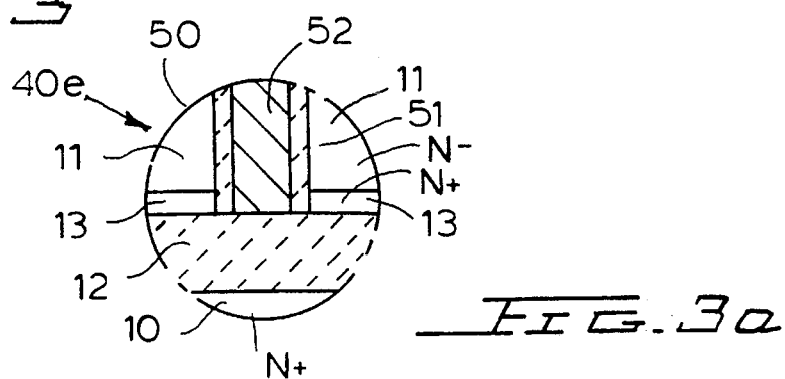
FIG. 3a shows a detail of the isolation trench of FIGS. 2 and 3.

After the trench array 40 is formed, a thin oxide is thermally grown on its interior walls, shown in FIG. 3a as oxide layers 50 and 51, and the central gap between them is then filled with polysilicon 52. Thus, a plurality of identical dielectrically isolated photogenerator cells is formed in layer 11. The thickness of the oxides (or other dielectric) 50 and 51 is chosen to optimize reflectance of radiation at the interface with the silicon 11. (This improves the efficiency of the device.)

After forming the dielectrically isolated tubs of FIG. 2, diffusions forming the photovoltaic cells are formed in the surface of wafer 11. Thus, using suitable photolithography techniques, an array of rectangular or other shape shallow P⁺ diffusions 20 to and square ring-shaped N⁺ contact diffusions 25 to 29, shown in FIG. 3, which encircle P⁺ diffusions 20 to 24 respectively, is formed in wafer 11. Typically, for a wafer which is 5 inches in diameter, 88,000 spaced P⁺ diffusions may be formed across the wafer to make about 9,000 die. Obviously, all P and N conductivity types can be reversed.

In one preferred embodiment of the invention, P⁺ regions 20 to 24 have a depth of 2 micrometers and an area of 9 mils by 9 mils. The P⁺ regions may be formed by an implant dose of boron of 5E18 per $cm^2$ with a peak concentration of 5E18 per $cm^3$.

Figure 3B:
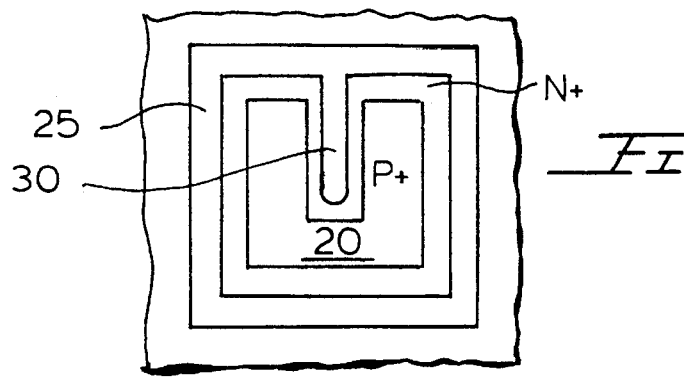
FIG. 3b is a top view of a portion of the wafer of FIG. 3, and shows an $N^+$ finger extending from the $N^+$ contact ring.

The N⁺ rings 25 to 28 have a depth of 1 micrometer and a width of 0.5 mil and an inner circumference of 34 mils. Rings 25 to 28, shown in FIG. 3b, may be formed of an arsenic implant at a dose of 8E15 per $cm^2$ with a peak concentration of 4E20 per $cm^3$. A central N⁺ collecting finger 30, shown in FIG. 3b for ring 25, can be disposed at the center of each P⁺ diffusion. Finger 30 may have a width of 0.5 mil and a length of about 7 mils.

Figure 4:
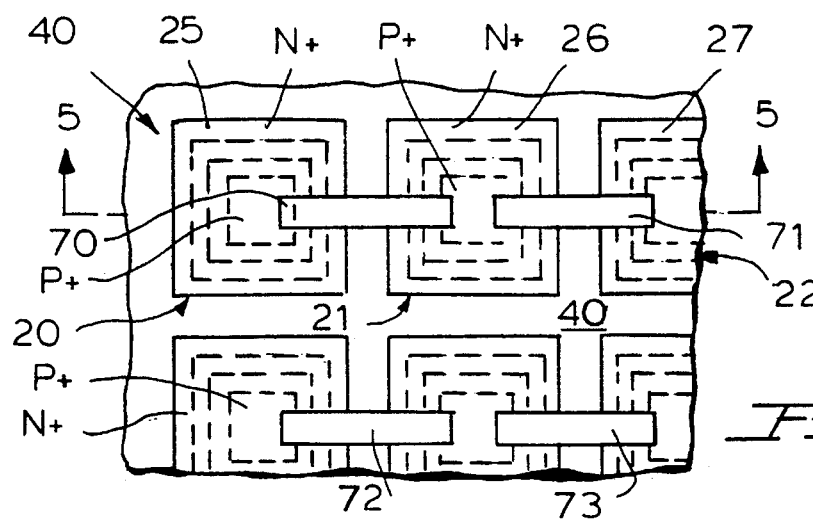
FIG. 4 shows a top view of a portion of the device of FIG. 3 after the formation of contacts to connect the devices in series.
Figure 5:
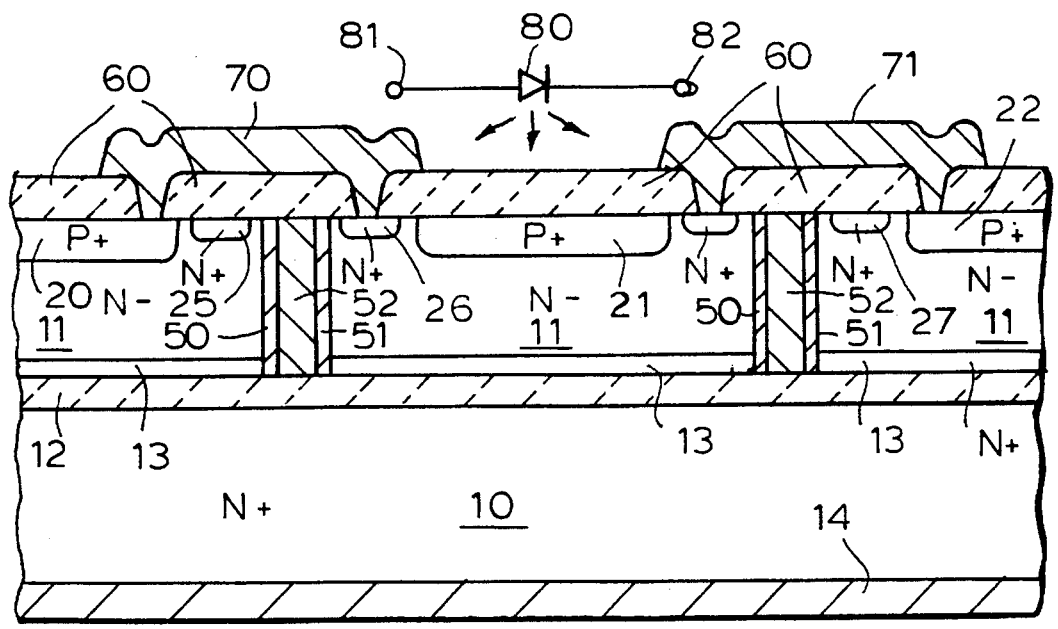
FIG. 5 is a cross-sectional view of the structure of FIG. 4, taken across the section line 5—5 in FIG. 4.

As next shown in FIG. 5, an oxide layer 60 is deposited atop the surface of wafer 11. A contact mask then patterns the oxide to form contact openings to the N⁺ and P⁺ regions. Thereafter, a contact metal is deposited atop the oxide layer 60 and the metal is etched to form contact strips 70, 71, 72 and 73, shown in FIGS. 4 and 5, to connect the P⁺ diffusion of one cell to the N⁺ contact diffusion of an adjacent cell.

After the device is completed, the wafer may be coated with a protective transparent coating. The wafer is thereafter diced into units of 16 series-connected cells which have respective solder pad terminals (not shown) to produce devices which can produce 7 volts and 2.5 microamperes when illuminated by an LED.

Thus, the individual devices may be mounted with an LED 80 (in FIG. 5) insulated therefrom but arranged to produce radiation which illuminates the surface of the wafer or chip. LED 80 is turned on by a suitable input to its terminals 81 and 82 which are dielectrically insulated from the output terminals of the chip. Any suitable LED can be used.

If desired, the PVG structure described above (except for the LED) qan be integrated into the same chip which contains the power MOS-gated device to be controlled by the photogenerator structure.

Figure 6:
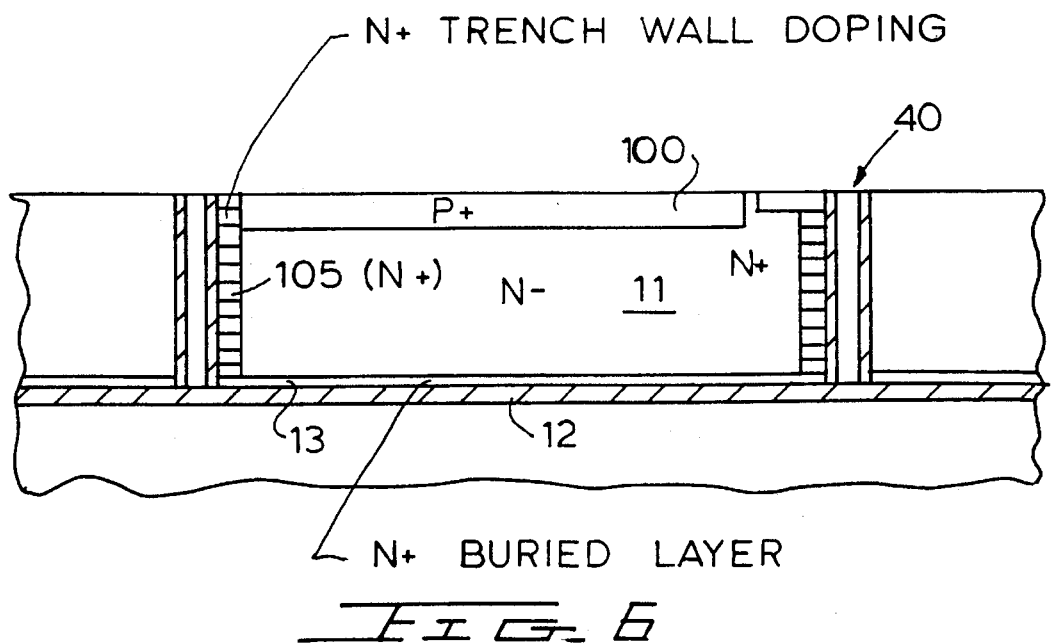
FIG. 6 is a cross-section of one cell of a second embodiment of the present invention, and is a cross-section along lines 6—6 of FIG. 7.
Figure 7:
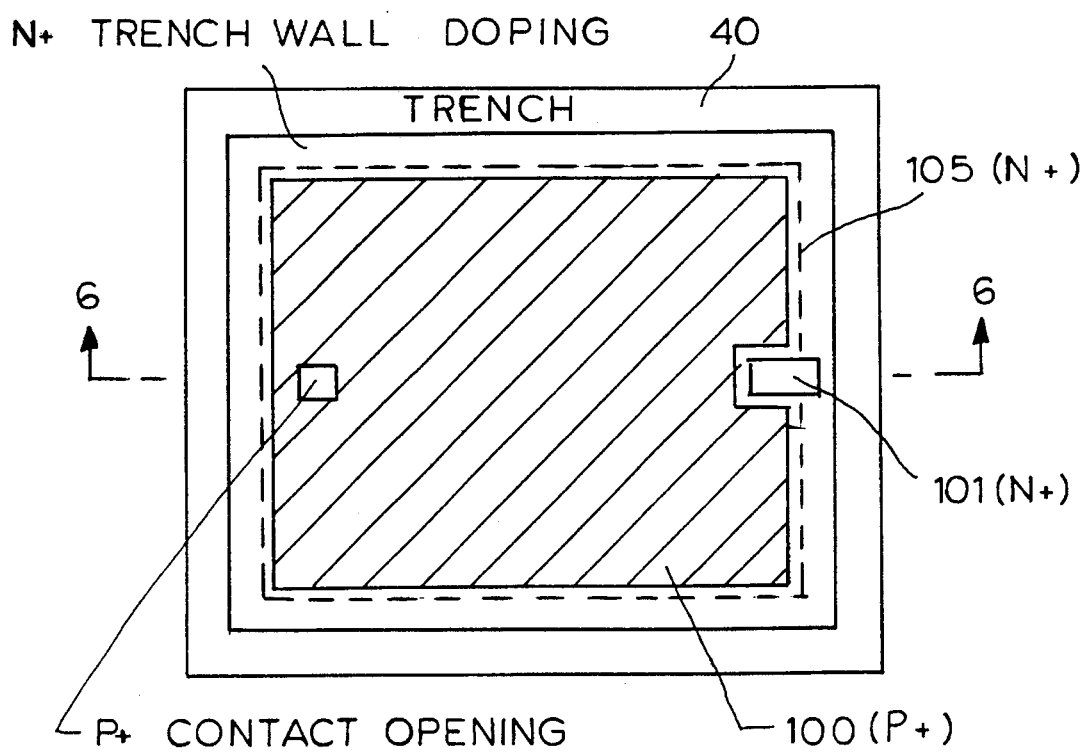
FIG. 7 is a top plan view of the cell of FIG. 6.
Figure 3B:
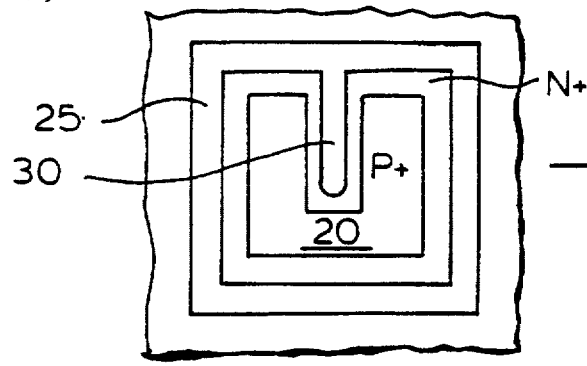
Figure 4:
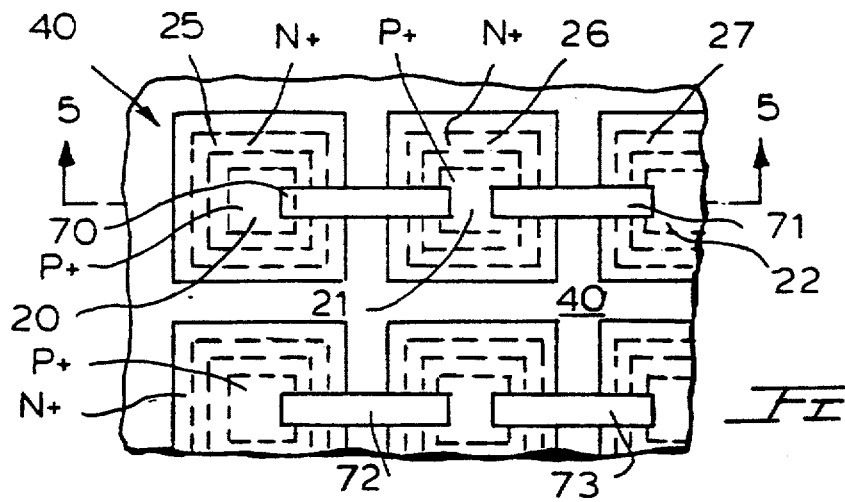
Figure 5:
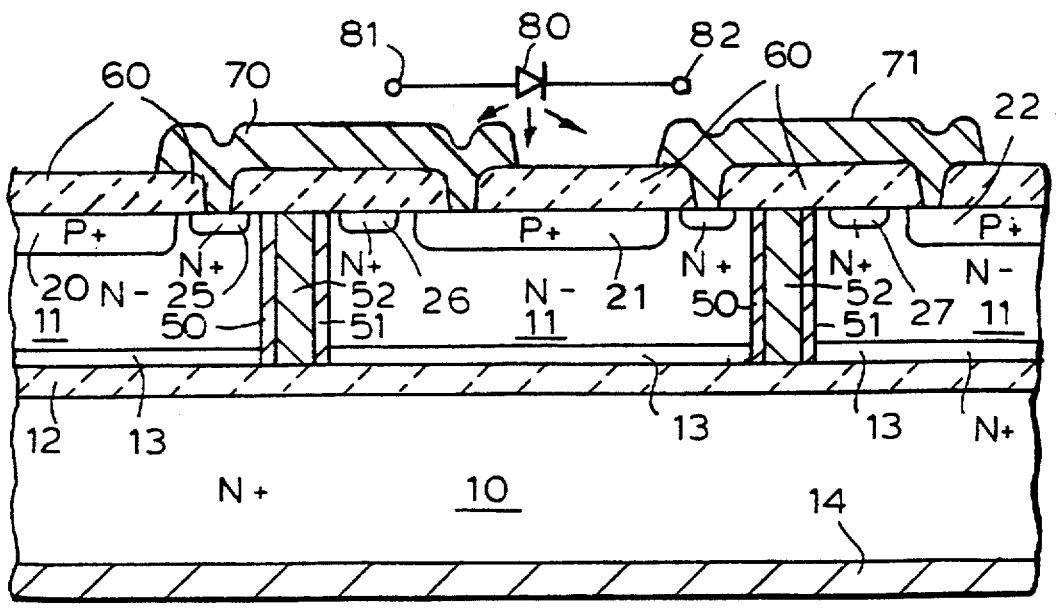

FIGS. 6 and 7 show a second embodiment of a cell arrangement with a different contact configuration. In the description of FIGS. 6 and 7, similar numerals identify similar parts to those of FIGS. 1 to 5. The processing sequence is also the same except for changes specifically described. Thus, the device of FIGS. 6 an 7 employs a larger area P⁺ diffusion 100. Further, in the embodiment of FIGS. 6 and 7, the N⁻ wafer 11 has a resistivity greater than about 27 ohm centimeters. P⁺ region 100 is identical in depth and concentration to that of FIGS. 2 to 5. However, only a small N⁺ contact diffusion is employed which is 1 micrometer deep but only 0.5 mil by 0.5 mil. Further, the interior walls of trenches 40 receive a thin N⁺ coating 105 formed, for example, by diffusion from POCl, to a depth of about 5 micrometers and with a surface concentration of about 2E18 per $cm^3$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

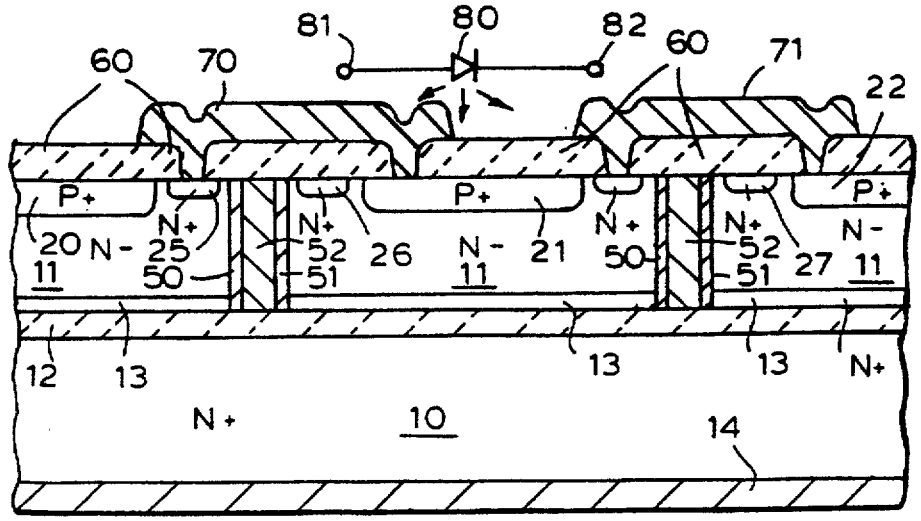

What is claimed is:

1. A photovoltaic generator comprising, in combination, a wafer consisting of a bonded assembly having a flat relatively thick handle wafer and a flat relatively thin junction receiving layer; said handle wafer and said junction receiving layer being joined together by a thin dielectric bonding layer; said junction receiving layer being lightly doped of one conductivity type; a mesh-shaped thin trench which extends from the outer surface of said junction receiving layer to said thin dielectric bonding layer thereby dividing said junction receiving layer into a plurality of electrically insulated tubs, said trench being formed by processing said bonded assembly, the walls of said trench being lined with a thin dielectric layer and further containing a polysilicon filler; the flat outer surface of each of said tubs having a relatively shallow diffusion of the opposite conductivity type therein, whereby radiation which reaches the junction between said shallow diffusion and the body of said lightly doped material of said tub will generate an output photovoltaic voltage; and connector means for connecting said shallow diffusion of at least two of said tubs to the lightly doped material of adjacent tubs.

2. The photovoltaic generator of claim 1, wherein said one conductivity type is the N type.

3. The photovoltaic generator of claim 1, wherein said junction receiving layer contains a thin high concentration buffer layer of said one conductivity type adjacent to said thin dielectric bonding layer.

4. The photovoltaic generator of claim 3, wherein said one conductivity type is the N type.

5. The photovoltaic generator of claim 1, wherein the opposing walls of said trench contain a shallow diffusion of said one conductivity type.

6. The photovoltaic generator of claim 5, wherein said one conductivity type is the N type.

7. The photovoltaic generator of claim 5, wherein said junction receiving layer contains a thin high concentration buffer layer of said one conductivity type adjacent to said thin dielectric bonding layer.

8. The photovoltaic generator of claim 1, which includes an increased concentration contact diffusion of said one conductivity type at the top of each of said tubs, which is laterally spaced from said diffusion of said other conductivity type.

9. The photovoltaic generator of claim 8, wherein said one conductivity type is the N type.

10. The photovoltaic generator of claim 8, wherein said junction receiving layer contains a thin high concentration buffer layer of said one conductivity type adjacent to said thin dielectric bonding layer.

11. The photovoltaic generator of claim 8, wherein said contact diffusion in each of said tubs has a ring shape which surrounds and is spaced from the periphery of said diffusion of said other conductivity type.

12. The photovoltaic generator of claim 11, wherein said contact diffusion in each of said tubs includes a collecting strip that is substantially surrounded by said diffusion of said other conductivity type.

13. The photovoltaic generator of claim 8, wherein said contact diffusion is a small area rectangle which is spaced from the periphery of said diffusion of said other conductivity type.

14. The photovoltaic generator of claim 13, wherein said contact diffusion in each of said tubs includes a collecting strip that is substantially surrounded by said diffusion of said other conductivity type.

15. The photovoltaic generator of claim 8, wherein said contact diffusion in each of said tubs includes a collecting strip that is substantially surrounded by said diffusion of said other conductivity type.

16. The photovoltaic generator of claim 1, wherein said polysilicon filler is arranged between said liners of dielectric material.

17. The photovoltaic generator of claim 16, wherein the opposite walls of said trench contain a shallow diffusion of said one conductivity type.

18. The photovoltaic generator of claim 1, wherein the opposite walls of said trench contain a shallow diffusion of said one conductivity type.

19. The photovoltaic generator of claim 1, wherein each of said tubs has a polygonal shape at its upper surface.

20. The photovoltaic generator of claim 1, wherein each of said tubs has a rectangular periphery.

* * * * *

UNITED STATES PATENT AND TRADEMARK OFFICE
CERTIFICATE OF CORRECTION

PATENT NO.   : 5,549,762

DATED        : August 27, 1996

INVENTOR(S)  : William F. Cantarini

It is certified that error appears in the above-identified patent and that said Letters Patent is hereby corrected as shown below:

On the title page, showing the illustrative figure, should be deleted and substitute therefor the attached title page.

In Figure 4, the reference numeral lines to the central $P^+$ diffusions 20, 21, 22 and to $N^+$ rings 25, 26, 27 are corrected as shown; and in Figure 5, on the left, contact strip 70 and oxide layers 60 are shifted to the right so that $N^+$ region 25 is connected to $P^+$ region 21 as shown on the attached page.

Signed and Sealed this

Tenth Day of June, 1997

Attest:

BRUCE LEHMAN

*Attesting Officer*   *Commissioner of Patents and Trademarks*

United States Patent [19]

Cantarini

[11] Patent Number: 5,549,762
[45] Date of Patent: Aug. 27, 1996

[54] PHOTOVOLTAIC GENERATOR WITH DIELECTRIC ISOLATION AND BONDED, INSULATED WAFER LAYERS

[75] Inventor: William F. Cantarini, Redondo Beach, Calif.

[73] Assignee: International Rectifier Corporation, El Segundo, Calif.

[21] Appl. No.: 372,600

[22] Filed: Jan. 13, 1995

[51] Int. Cl.⁶ .......................................... H01L 31/05
[52] U.S. Cl. ................................... 136/249; 437/2
[58] Field of Search ........................ 136/249 MS

[56] References Cited

U.S. PATENT DOCUMENTS

| | | | |
|---|---|---|---|
| 3,994,012 | 11/1976 | Warner, Jr. ................ | 136/246 |
| 4,227,098 | 10/1980 | Brown et al. ............... | 307/117 |
| 4,268,843 | 5/1981 | Brown et al. ............... | 257/82 |
| 4,390,790 | 6/1983 | Rodriguez ................... | 250/551 |
| 4,477,721 | 10/1984 | Chappell et al. ........... | 257/82 |
| 4,612,408 | 9/1986 | Moddel et al. ............. | 136/244 |
| 4,755,697 | 7/1988 | Kinzer ......................... | 327/432 |
| 4,864,126 | 9/1989 | Walters et al. ............. | 250/551 |
| 4,916,323 | 4/1990 | Hayashi et al. ............. | 250/551 |
| 4,931,656 | 6/1990 | Ehalt et al. ................. | 250/551 |
| 5,045,709 | 9/1991 | Ogawa ......................... | 250/551 |
| 5,057,694 | 10/1991 | Idaka et al. ................. | 250/551 |
| 5,105,090 | 4/1992 | Miyajima et al. ........... | 250/551 |
| 5,151,602 | 9/1992 | Idaka et al. ................. | 250/551 |
| 5,260,592 | 11/1993 | Mead et al. ................. | 257/291 |
| 5,357,121 | 10/1994 | Miyashita et al. .......... | 257/79 |

FOREIGN PATENT DOCUMENTS 1-273362  11/1989  Japan ........................ 136/249 MS

*Primary Examiner*—Aaron Weisstuch
*Attorney, Agent, or Firm*—Ostrolenk, Faber, Gerb & Soffen, LLP

[57] ABSTRACT

A photovoltaic generator device for producing an output sufficient to turn on a MOS-gated device consists of a plurality of planar photogenerators connected in series. Each of the photovoltaic generators is contained on its own respective insulated tub. The insulated tubs are formed by wafer bonding a junction-containing wafer to a handle wafer with a dielectric isolation layer between them. The individual tubs are formed at their sides by isolation trenches which enclose each tub and which extend to the dielectric layer between the junction-containing and handle wafers. Each tub is formed of an $N^-$ body having a shallow $P^+$ diffusion. $N^+$ contact regions are formed in the $N^-$ body and contact strips connect the devices of each of the tubs in series by connecting the $P^+$ diffusions of one tub to the $N^+$ contact of an adjacent tub.

20 Claims, 3 Drawing Sheets